US009412632B2

(12) United States Patent
Lee et al.

(10) Patent No.: US 9,412,632 B2
(45) Date of Patent: Aug. 9, 2016

(54) RETICLE POD

(71) Applicant: Taiwan Semiconductor Manufacturing Company, Ltd., Hsin-Chu (TW)

(72) Inventors: Tsung-Yen Lee, Jhudong Township (TW); Jeng-Horng Cheng, Hsin-Chu (TW); Jui-Ching Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 546 days.

(21) Appl. No.: 13/660,801

(22) Filed: Oct. 25, 2012

(65) Prior Publication Data

US 2014/0116920 A1  May 1, 2014

(51) Int. Cl.
  *B65D 85/48*  (2006.01)
  *H01L 21/673*  (2006.01)
  *B65D 81/20*  (2006.01)

(52) U.S. Cl.
  CPC ...... *H01L 21/67393* (2013.01); *B65D 81/2015* (2013.01); *B65D 85/48* (2013.01); *H01L 21/67359* (2013.01); *H01L 21/67376* (2013.01)

(58) Field of Classification Search
  CPC ............... B65D 85/48; B65D 81/2015; H01L 21/67359; H01L 21/67376; H01L 21/67393
  USPC ............. 206/213.1, 454, 524.8, 710; 118/500
  See application file for complete search history.

(56) References Cited

U.S. PATENT DOCUMENTS

| 5,740,845 | A  | * | 4/1998  | Bonora et al. ................. 206/710 |
| 6,216,873 | B1 | * | 4/2001  | Fosnight et al. .............. 206/710 |
| 7,528,936 | B2 | * | 5/2009  | Gregerson et al. ............ 206/710 |
| 7,648,041 | B2 | * | 1/2010  | Ueda ................ H01L 21/67126 206/710 |
| 8,074,597 | B2 | * | 12/2011 | Shah et al. .................... 118/500 |
| 8,403,143 | B2 | * | 3/2013  | Chiu et al. .................... 206/454 |
| 2005/0252827 | A1 | * | 11/2005 | Tieben ............. H01L 21/67379 206/710 |
| 2006/0076264 | A1 | * | 4/2006  | CletusWittman ......... G03F 1/66 206/710 |
| 2008/0041760 | A1 | * | 2/2008  | Durben .................... G03F 1/66 206/710 |
| 2009/0038976 | A1 | * | 2/2009  | Lin et al. ........................ 206/454 |
| 2011/0114129 | A1 | * | 5/2011  | Kishkovich ....... H01L 21/67769 206/710 |
| 2012/0175279 | A1 | * | 7/2012  | Ku et al. ....................... 206/454 |

* cited by examiner

*Primary Examiner* — Luan K Bui
(74) *Attorney, Agent, or Firm* — Slater Matsil, LLP

(57) ABSTRACT

A reticle pod includes an outer pod shell and an outer pod door disposed under the outer pod shell. The outer pod door has at least one gas control hole. A seal ring is disposed between the outer pod shell and the outer pod door. A valve is disposed in each gas control hole. The outer pod shell and the outer pod door are configured to form an enclosure space in order to store a reticle. The seal ring seals the gap between the outer pod shell and the outer pod door. The at least one valve is configured to control gas flow in and out of the enclosure space.

19 Claims, 5 Drawing Sheets

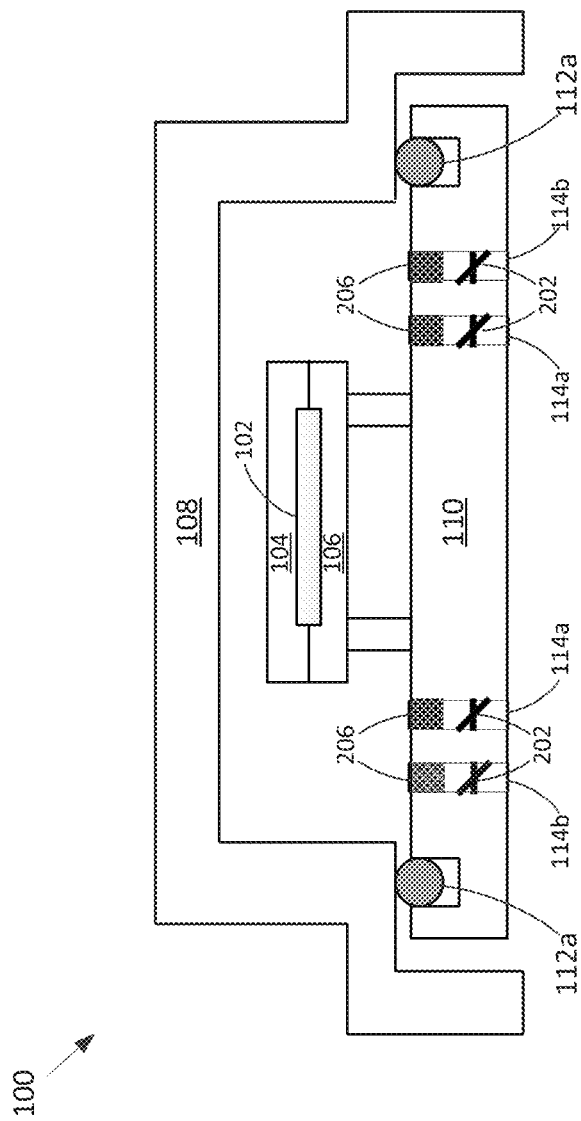

RETICLE POD

TECHNICAL FIELD

The present disclosure relates generally to a reticle pod.

BACKGROUND

Reticle pods are used to store reticles. For some reticle pods, reticles are subject to the risk of particle contamination and chemical outgassing because the reticle pods are not fully sealed. To control such contamination, a purge gas is used to continuously purge the reticle pod.

BRIEF DESCRIPTION OF THE DRAWINGS

Reference is now made to the following descriptions taken in conjunction with the accompanying drawings, in which:

FIG. 1 is a schematic diagram of an exemplary reticle pod according to some embodiments;

DETAILED DESCRIPTION

Figure 2C:
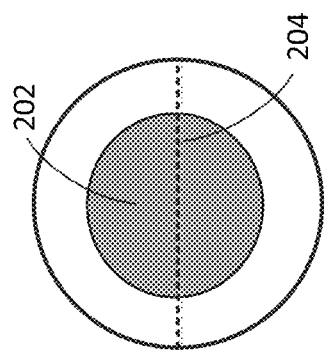
FIG. 2C is a bottom view of the gas control hole in FIG. 2A when the valve inside is closed according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary reticle pod 100 according to some embodiments. The reticle pod 100 includes an outer pod shell 108 and an outer pod door 110 that is disposed under the outer pod shell 108. The outer pod shell 108 and the outer pod door 110 form an enclosure space to store a reticle 102. The reticle 102 comprises $SiO_2$ and $TiO_2$ films in some embodiments and has a size of 150×150 mm in one example.

The outer pod shell 108 and the outer pod door 110 comprise PEEK (polyether ether ketone), another polymer, or any other suitable material. One exemplary outer pod shell 108 and has a size of 280×290×80 mm and one exemplary outer pod door 110 has a size of 260×270×40 mm. The outer pod shell 108 and the outer pod door 110 can have any other size suitable for various applications.

The outer pod door 110 has at least one gas control hole such as gas purge holes 114a and vacuum holes 114b. Each gas control hole such as 114a or 114b has a valve such as 202 in FIG. 2A and a filter element such as 206 in FIG. 2A to fully seal the reticle pod 100 when the valve 202 is closed. Even though two gas purge holes 114a and two vacuum holes 114b are shown in FIG. 1, any number of gas control hole(s) such as one, two, three, . . . , etc. can be implemented in other embodiments that may also combine the function of the gas purge hole 114a and the vacuum hole 114b.

A seal ring 112a is disposed between the outer pod shell 108 and the outer pod door 110. The seal ring 112a seals the gap between the outer pod shell 108 and the outer pod door 110. The seal ring 112a has a circular cross section shape in FIG. 1, but may have any other shapes in other embodiments. The seal ring 112a comprises fluorocarbon such as commercially available Viton, nitrile butadiene rubber (NBR), or any other suitable material.

An inner pod cover 104 and an inner pod base plate 106 are arranged to store a reticle 102 inside the reticle pod 100. The inner pod cover 104 and the inner pod base plate 106 comprise electroless nickel, stainless steel, or any other suitable material. One exemplary inner pod cover 104 has a size of 220×190×20 mm and one exemplary inner pod base plate 106 has a size of 190×190×10 mm. The inner pod cover 104 and the inner pod base plate 106 can have any other size suitable for various applications.

The reticle pod 100 is fully sealed and capable of maintaining a vacuum pressure ranging from $10^{-2}$ to $10^{-7}$ torr in some embodiments. The reticle pod 100 is used for extreme ultraviolet (EUV) reticle pod in some embodiments. By fully sealing the reticle pod 100, the contamination risk from reticle particles, chemical elements, and/or outgassing can be avoided.

Further, the reticle storage procedure can be simplified because the fully sealed reticle pod 100 does not need continuous purging of gas. After vacuuming and purging with a purge gas such as nitrogen, the reticle pod 100 can be put into storage. In comparison, for some other reticle pods that are not fully sealed, the reticle pods are continuously purged using a purge gas such as commercially available extreme clear dry air (XCDA).

Figure 2B:
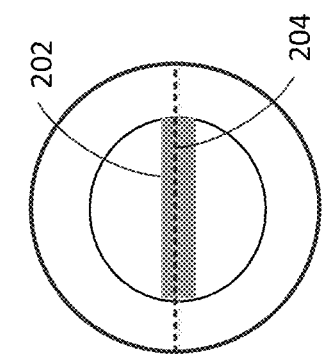
FIG. 2B is a bottom view of the gas control hole in FIG. 2A when the valve inside is opened according to some embodiments.
Figure 2A:
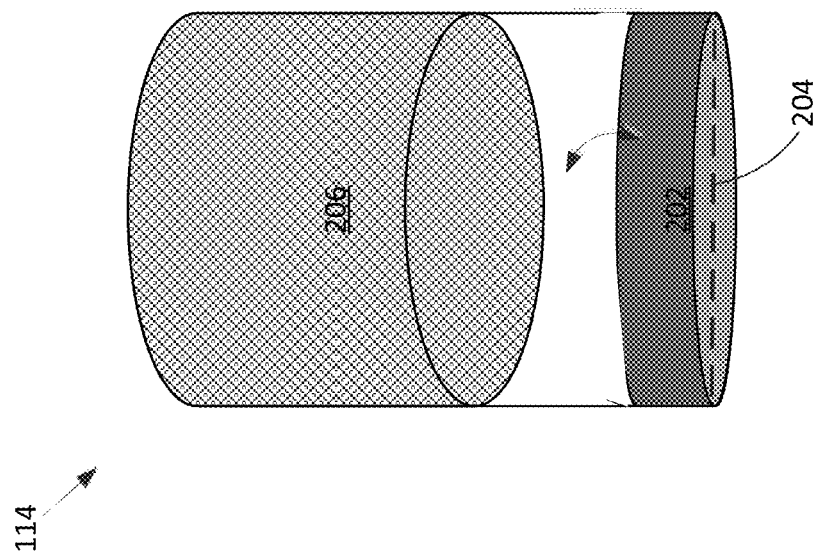
FIG. 2A is a schematic diagram of a gas control hole in the exemplary reticle pod in FIG. 1 according to some embodiments.

FIG. 2A is a schematic diagram of a gas control hole 114 (representing 114a and 114b) in the exemplary reticle pod 100 in FIG. 1 according to some embodiments. In some embodiments, the gas control hole 114 has a diameter of 8 mm-15 mm, and can have any other suitable size in other embodiments. The valve 202 and filter element 206 are shown inside the gas control hole 114. The valve 202 is arranged to control a gas flow in and out of the enclosure space of the reticle pod 100.

The valve 202 comprises stainless or any other suitable material. In some embodiments, the valve 202 has an inner diameter of 4 mm-8 mm and an outer diameter of 8 mm-15 mm, and can have any other suitable size in other embodiments. The filter element 206 is disposed in the gas control hole 114 to filter out contaminants or particles in the gas moving in and out of the gas control hole 114. The filter element 206 comprises ultra-high molecular weight polyethylene (UPE) or any other suitable material. The filter element 206 has a specification of less than 30 nm in some embodiments. In one example, the filter element 206 has a diameter of 7 mm with 0.1 mm thickness and has a specification of 30 nm for particle control and good speed for purge in/out.

FIG. 2B is a bottom view of the gas control hole 114 in FIG. 2A when the valve 202 inside is opened (e.g., by rotating around a rotation axis 204) according to some embodiments. The valve 204 is rotated 90 degrees around the rotation axis 204 from a closed position in FIG. 2A to an open position to allow gas move in or out.

FIG. 2C is a bottom view of the gas control hole 114 in FIG. 2A when the valve 202 inside is closed (by rotating around a rotation axis 204) according to some embodiments. The valve 202 is rotated 90 degrees around the rotation axis 204 from the open position in FIG. 2B so that the gas control hole 114 is sealed and there is no gas movement in or out.

Figure 2D:
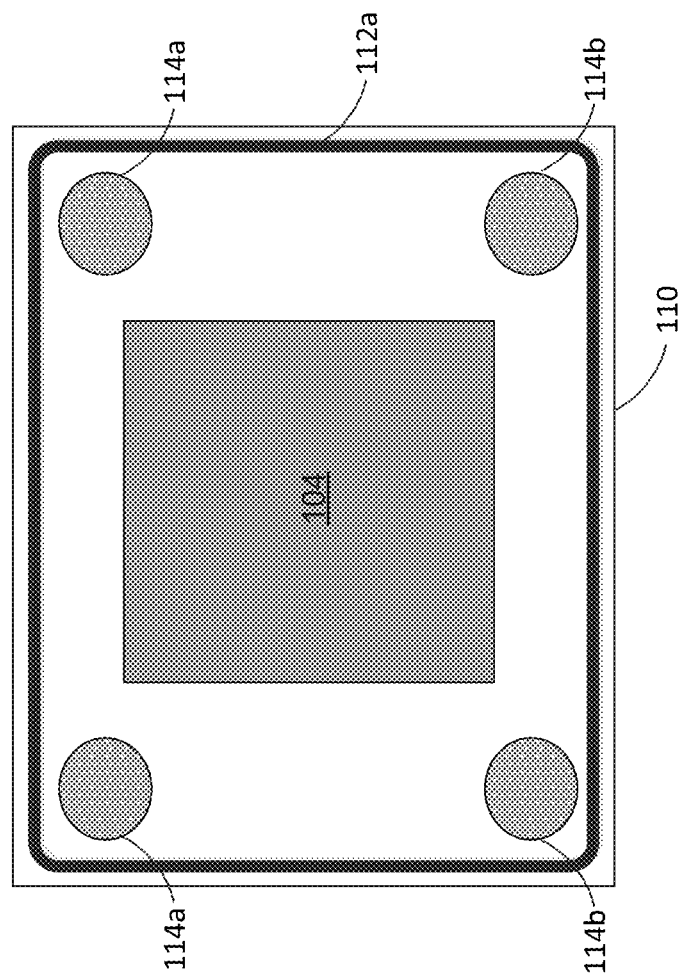
FIG. 2D is a top view of the outer pod door of the reticle pod in FIG. 1 according to some embodiments.

FIG. 2D is a top view of the outer pod door 110 of the reticle pod 100 in FIG. 1 according to some embodiments. The seal ring 112a is shown along the edges. The gas purge holes 114a and vacuum holes 114b are arranged on both sides of the inner reticle cover 104 so that the gas flow will be evenly distributed. In other embodiments, different number of gas control holes can be used, e.g., one, two, or any other number. (The gas purge hole 114a and vacuum hole 114b can be combined in some embodiments.)

Figure 3:
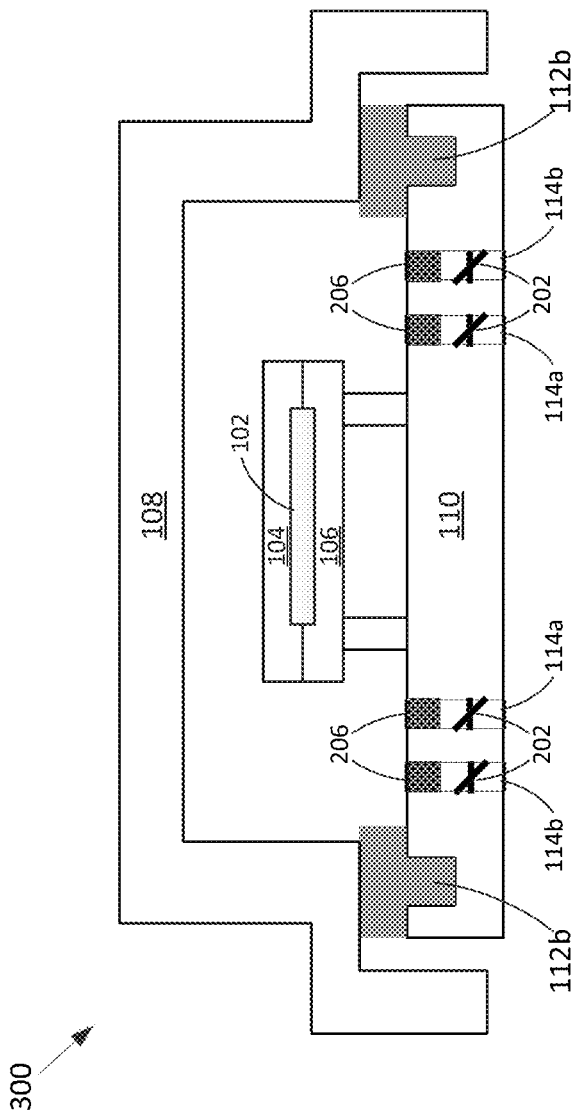
FIG. 3 is a schematic diagram of another exemplary reticle pod according to some embodiments.

FIG. 3 is a schematic diagram of another exemplary reticle pod 300 according to some embodiments. The reticle pod 300 is similar to the reticle pod 100 except that the cross section of the seal ring 112b in FIG. 3 has a flat top shape to increase the sealing area between the outer pod shell 108 and the outer pod door 110. The cross section of the seal ring 112b has a T shape in FIG. 3, and it can be any other flat top shape or any other shape suitable to fully seal the reticle pod 300. The reticle pod 300 is used for extreme ultraviolet (EUV) reticle pod in some embodiments.

Figure 4:
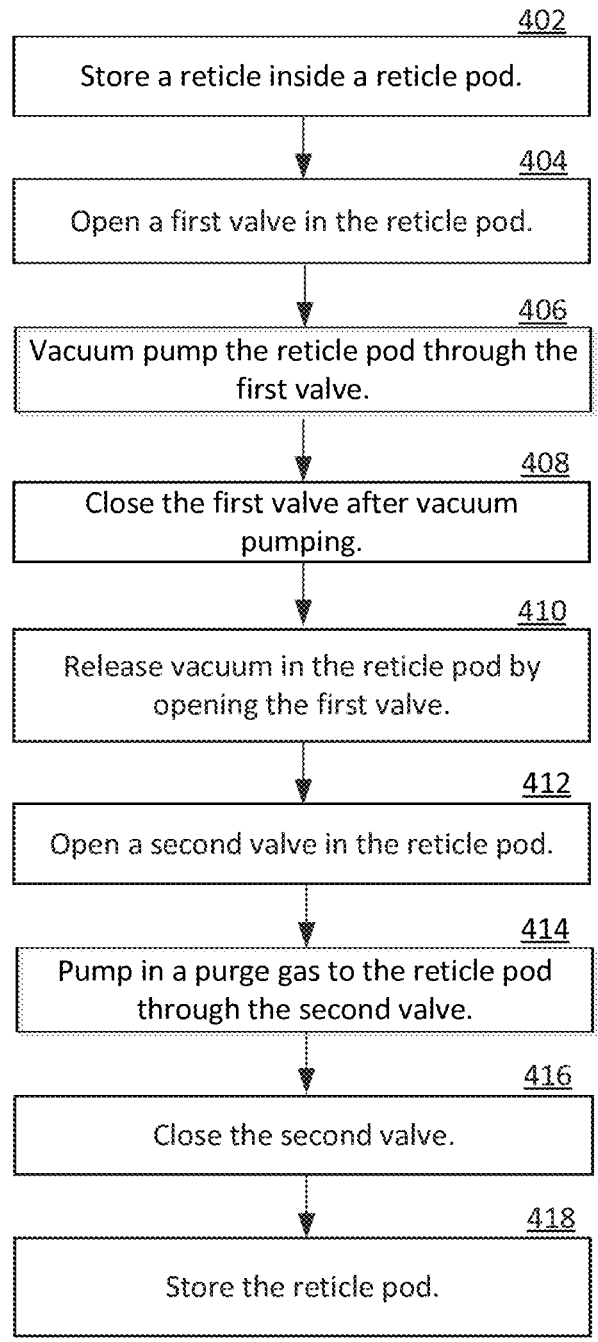
FIG. 4 is a flowchart of an exemplary method for the reticle pod in FIG. 1 and/or FIG. 3 according to some embodiments.

FIG. 4 is a flowchart of an exemplary method for the reticle pod in FIG. 1 and/or FIG. 3 according to some embodiments. At step 402, a reticle is stored inside a reticle pod. At step 404, a first valve in the reticle pod, e.g., in a vacuum hole, is opened. At step 406, the reticle pod is vacuum-pumped through the first valve to avoid the contamination risk from particles and/or outgassing. The vacuum pressure ranges from $10^{-2}$ to $10^{-7}$ torr in some embodiments. At step 408, the first valve is closed after vacuum pumping. At step 410, the vacuum pressure in the reticle pod is released, e.g., to a pressure of 1 bar, by opening the first valve.

At step 412, a second valve in the reticle pod, e.g., in a gas purge hole, is opened. At step 414, a purge gas is pumped in to the reticle pod through the second valve. In some embodiments, nitrogen or commercially available extreme clear dry air (XCDA) is used as the purge gas. Any other suitable purge gas or combination thereof can be also used in other embodiments. At step 416, the second valve is closed. At step 418, the reticle pod is stored. There is no need for continuous pumping of the purge gas because the reticle pod is fully sealed in some embodiments.

According to some embodiments, a reticle pod includes an outer pod shell and an outer pod door disposed under the outer pod shell. The outer pod door has at least one gas control hole. A seal ring is disposed between the outer pod shell and the outer pod door. A valve is disposed in each gas control hole. The outer pod shell and the outer pod door are configured to form an enclosure space in order to store a reticle. The seal ring seals the gap between the outer pod shell and the outer pod door. The at least one valve is configured to control gas flow in and out of the enclosure space.

According to some embodiments, a method includes loading a reticle inside a reticle pod. A valve in the reticle pod is opened for vacuum pumping. The reticle pod is vacuum pumped through the opened first valve.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A reticle pod, comprising:
    an inner pod cover;
    an inner pod base plate, wherein the inner pod cover and the inner pod base plate are configured to form an inner space to store a reticle;
    an outer pod shell;
    an outer pod door disposed under the outer pod shell, the outer pod door having two gas purge holes and two vacuum holes;
    a seal ring disposed between the outer pod shell and the outer pod door; and
    four valves, each valve disposed in a respective gas purge hole or vacuum hole;
    wherein the outer pod shell and the outer pod door are configured to form an enclosure space around the inner pod cover and the inner pod base plate, the seal ring seals a gap between the outer pod shell and the outer pod door, the four valves are configured to control gas flow in and out of a same chamber of the enclosure space, an outer edge of the chamber being bounded by the outer pod door and the outer pod shell, and wherein the four valves are located within a solid section of the outer pod door and do not extend beyond the solid section of the outer pod door.

2. The reticle pod of claim 1, wherein the enclosure space is capable of maintaining a vacuum pressure ranging from 10-2 to 10-7 torr.

3. The reticle pod of claim 1, further comprising at least one filter element, wherein each of the at least one filter element is disposed in a respective gas purge hole or vacuum hole.

4. The reticle pod of claim 3, wherein the at least one filter element has a specification of less than 30 nm.

5. The reticle pod of claim 1, wherein a cross section of the seal ring has a circular shape.

6. The reticle pod of claim 1, wherein a cross section of the seal ring has a flat top shape.

7. The reticle pod of claim 6, wherein the cross section of the seal ring has a T shape.

8. The reticle pod of claim 1, wherein the outer pod shell and the outer pod door comprise a polymer.

9. The reticle pod of claim 1, further comprising a reticle in the enclosure space, the reticle comprising SiO2 and TiO2 films.

10. A reticle pod, comprising:
   an inner pod cover;
   an inner pod base plate;
   an outer pod shell;
   an outer pod door disposed under the outer pod shell, the outer pod door having at least one gas control hole;
      a seal ring disposed between the outer pod shell and the outer pod door, wherein a cross section of the seal ring has a circular shape;
   at least one valve, each valve disposed in the respective gas control hole and within the outer pod door such that it does not extend beyond edges of the outer pod door; and
   at least one filter element disposed in the respective gas control hole;
   wherein the outer pod shell and the outer pod door are configured to form a first enclosure space, the inner pod cover and the inner pod base plate are configured to store a reticle inside a second enclosure space, the second enclosure space being comprised in the first enclosure space; and
   wherein the seal ring seals a gap between the outer pod shell and the outer pod door, and the at least one valve is configured to control gas flow in and out of a chamber, the chamber being comprised within the first enclosure space but not including the second enclosure space, an outer edge of the chamber being bounded by the outer pod door and the outer pod shell.

11. The reticle pod of claim 10, wherein the gas control hole comprises a gas purge hole, a vacuum hole, or a combination thereof.

12. The reticle pod of claim 10, wherein the first enclosure space is capable of maintaining a vacuum pressure ranging from 10-2 to 10-7 torr.

13. The reticle pod of claim 10, wherein the outer pod shell and the outer pod door comprise a polymer.

14. A reticle pod, comprising:
   an inner pod cover;
   an inner pod base plate, wherein the inner pod cover and the inner pod base plate are configured to store a reticle in an inner space;
   an outer pod shell;
   an outer pod door disposed under the outer pod shell, the outer pod shell and the outer pod door forming an enclosure space, the outer pod door having four gas control holes comprising gas purge holes, vacuum holes or a combination thereof, each gas control hole configured to control gas flow in and out of a same chamber of the enclosure space;
   a seal ring disposed between the outer pod shell and the outer pod door; and
   at least one valve, each at least one valve disposed in a respective gas control hole.

15. The reticle pod of claim 14, wherein the enclosure space is capable of maintaining a vacuum pressure ranging from 10-2 to 10-7 torr.

16. The reticle pod of claim 14, wherein a cross section of the seal ring has a circular shape, a flat top shape, or a T shape.

17. The reticle pod of claim 14, further comprising at least one filter element, wherein each of the at least one filter element is disposed in a respective gas control hole.

18. The reticle pod of claim 14, further comprising a reticle in the enclosure space, the reticle comprising SiO2 and TiO2 films.

19. The reticle pod of claim 14, wherein the outer pod shell and the outer pod door comprise a polymer.

* * * * *